United States Patent
Masenas et al.

(10) Patent No.: US 6,614,316 B2
(45) Date of Patent: Sep. 2, 2003

(54) FRACTIONAL INTEGRATION AND PROPORTIONAL MULTIPLIER CONTROL TO ACHIEVE DESIRED LOOP DYNAMICS

(75) Inventors: Charles J. Masenas, Essex Junction, VT (US); Anthony J. Perri, Jericho, VT (US); Troy A. Seman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 09/826,591

(22) Filed: Apr. 5, 2001

(65) Prior Publication Data

US 2002/0145473 A1 Oct. 10, 2002

(51) Int. Cl.$^7$ ................................................ H03L 7/00
(52) U.S. Cl. ........................................ 331/17; 331/1 A
(58) Field of Search .............................. 331/17, 25, 16, 331/1 A

(56) References Cited

U.S. PATENT DOCUMENTS

| | | | |
|---|---|---|---|
| 5,563,552 A | * 10/1996 | Gersbach et al. | 331/1 A |
| 5,764,108 A | * 6/1998 | Rose et al. | 331/17 |
| 5,939,949 A | * 8/1999 | Olgaard et al. | 331/17 |

* cited by examiner

*Primary Examiner*—Robert Pascal
*Assistant Examiner*—Joseph Chang
(74) *Attorney, Agent, or Firm*—McGinn & Gibb, PLLC; Richard A. Henkler, Esq.

(57) ABSTRACT

A frequency synthesizer includes a charge pump, a fractional integration counter that alters the integrated current of the charge pump, a phase frequency detector, a proportional correction circuit, and a proportional multiplier that alters the value of the current correction output by the proportional correction circuit. The fractional integration counter alters the integrated current of the charge pump based upon a user-defined input, thereby permitting increased signal-to-noise ratio at the output of the charge pump. Similarly, the proportional multiplier alters the value of the proportional current correction based upon user-defined input, thereby modifying loop dynamics within the frequency synthesizer.

14 Claims, 5 Drawing Sheets

20·log ( | P ( s(f), N$_{mid}$, 64, 1, Ko$_{midnom}$, Acal$_{nom}$, Aband$_{mid}$ ) | )

20·log ( | P ( s(f), N$_{mid}$, 16, 2, Ko$_{midnom}$, Acal$_{nom}$, Aband$_{mid}$ ) | )

20·log ( | P ( s(f), N$_{mid}$, 8, 3, Ko$_{midnom}$, Acal$_{nom}$, Aband$_{mid}$ ) | )

20·log ( | P ( s(f), N$_{mid}$, 4, 4, Ko$_{midnom}$, Acal$_{nom}$, Aband$_{mid}$ ) | )

FRACTIONAL INTEGRATION AND PROPORTIONAL MULTIPLIER CONTROL TO ACHIEVE DESIRED LOOP DYNAMICS

BACKGROUND OF THE INVENTION

1. Field of the Invention

The present invention generally relates to a frequency synthesizer and more particularly to an improved circuit for controlling loop dynamics of the frequency synthesizer.

2. Description of the Related Art

Conventional systems utilize frequency synthesizers for a wide range of purposes. For example, frequency synthesizers are used in computer storage systems (such as optical, magnetic, and the like). In order to record digital data onto the surface of a storage medium, which is typically in the form of a rotating magnetic or optical disk, surface characteristics of the disk are modified. Digital data modulates the operation of a write transducer (write head) which records binary sequences onto the disk in radially concentric or spiral tracks. In magnetic recording systems, for example, the digital data modulates the current in a write coil in order to record a series of magnetic flux transitions onto the surface of a magnetizable disk. And in optical recording systems, for example, the digital data may modulate the intensity of a laser beam in order to record a series of "pits" onto the surface of an optical disk. When writing this recorded data, a write transducer (write head), positioned in close proximity to the rotating disk, generates a sequence of corresponding pulses in an analog write signal.

The frequency synthesizer is used to code the pulses into a digital sequence. Discrete-time sequence detectors are preferred over simple analog pulse detectors because they compensate for intersymbol interference (ISI) and are less susceptible to channel noise. Consequently, discrete-time sequence detectors increase the capacity and reliability of the storage system.

A phase-locked-loop (PLL) frequency synthesizer normally implements the timing recovery decision-directed feedback system. The PLL comprises a phase detector for generating a phase error estimate based on the difference between the estimated samples and the write signal samples. A PLL loop filter filters the phase error, and the filtered phase error operates to synchronize the channel samples to the baud rate. Conventionally, the phase error adjusts the frequency of a sampling clock which is typically the output of a variable frequency oscillator (VFO). The output of the VFO controls a sampling device, such as an analog-to-digital (A/D) converter, to synchronize the sampling to the baud rate.

However, the loop dynamics of conventional frequency synthesizers is controlled using external components, which increases the size of the frequency synthesizer and decreases performance. Driving these external components requires increased power to overcome parasitic loading due to package and card wiring. This requires higher operating power.

SUMMARY OF THE INVENTION

In view of the foregoing and other problems, disadvantages, and drawbacks of the conventional frequency synthesizers, the present invention has been devised, and it is an object of the present invention to provide a structure and method for an improved frequency synthesizer.

In order to attain the object(s) suggested above, there is provided, according to one aspect of the invention, a frequency synthesizer that includes a charge pump, a fractional integration counter that alters the integrated current of the charge pump, a phase frequency detector, a proportional correction circuit, and a proportional multiplier that alters the value of the current correction output by the proportional correction circuit.

The fractional integration counter alters the integrated current of the charge pump based upon a user-defined input, thereby permitting increased signal-to-noise ratio at the output of the charge pump. Similarly, the proportional multiplier alters the value of the proportional current correction based upon user-defined input, thereby modifying loop dynamics within the frequency synthesizer.

With the invention, the fractional integration counter will allow raising the charge pump current and provide fixed acquisition and tracking current corrections so as to provide sufficient signal to noise ratio, while achieving a lower effective integration current. The fractional integration counter allows the user to adjusts loop dynamics by simply adjusting the FI (fractional integration) value. The proportional multiplier, when used with the fractional integration counter can adjust loop bandwidth and maintain damping or vice versa.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As discussed above, most hard disk drive (HDD) write channels use frequency synthesizers to control signal timing. The invention controls loop dynamics of a frequency synthesizer without using external components, and scales corrections from the integration charge pump in the frequency synthesizer. While the invention below is discussed in terms of a frequency synthesizer to be used with the write channel of a hard disk drive, as would be known by one ordinarily skilled in the art, the concepts discussed herein are equally applicable to all types of frequency synthesizers that are used to control circuits. Therefore, the invention should not be considered limited to hard disk drive write channel frequency synthesizers, but instead is applicable to all similar circuits.

Figure 1:
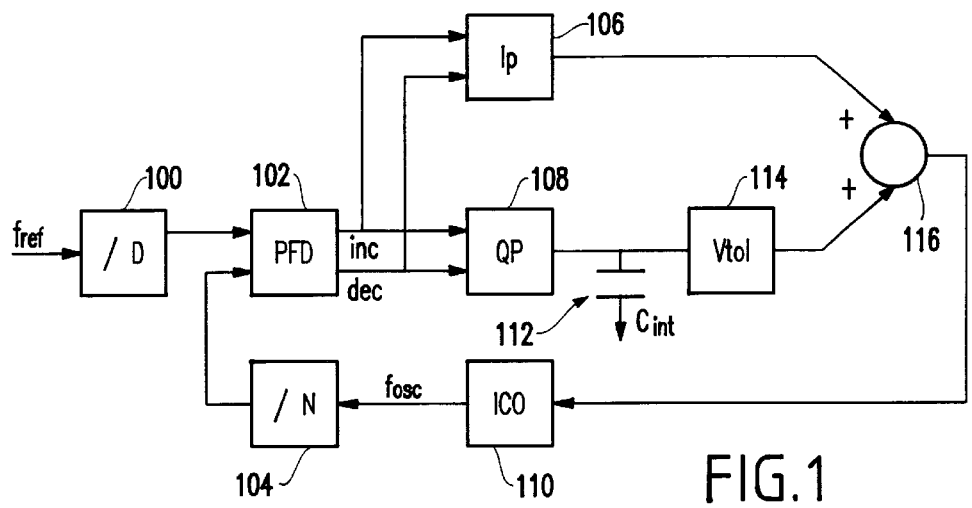
FIG. 1 is a schematic diagram of a frequency synthesizer.

A first embodiment of the invention is shown in FIG. 1. The frequency synthesizer in FIG. 1 includes a current controlled oscillator (ICO) 110, N and D frequency dividers 104, 100, phase-frequency detector (PFD) 102, and a proportional-integral (PI) loop filter. The PI filter includes a charge pump (QP) 108, integration capacitor (Cint) 112, voltage-to-current converter (VtoI) 114, and proportional correction (Ip) 106. The output of the proportional path 106 is summed with the output of the integral path or VtoI 114 by the summation unit 116. The summed current from the summation unit 116 is input to the ICO 110. The synthesized oscillator frequency $f_{osc}$, is a rational multiple N/D of the input reference frequency, $f_{ref}$.

The input signal $f_{ref}$ is divided by D frequency divider 100 to produce signal $f_{ref}/D$ The oscillator signal $f_{osc}$ is divided by N frequency divider 104 to produce signal $f_{osc}/N$. Signals $f_{ref}/D$ and $f_{osc}/N$ are inputs to PFD 102. The PFD 102 produces inc (increment) or dec (decrement) corrections that are proportional to the phase difference of its input signals. If signal $f_{ref}/D$ leads $f_{osc}/N$, then the inc correction will be high and the dec will be low. The QP 108 will produce a current that will add charge to Cint 112, increasing the capacitor voltage, and the VtoI 114 output current will increase as a result of the increased capacitor voltage. The proportional correction 106 will produce a positive output current, which is summed with the VtoI 114 output current. The resultant increase in control current into the ICO 110 will increase the frequency $f_{osc}$ and reduce the phase difference between signals $f_{ref}/D$ and $f_{osc}/N$ Likewise, if signal $f_{ref}/D$ lags $f_{osc}/N$, then the loop will act to reduce the frequency $f_{osc}$.

The capacitor 112 shown in FIG. 1, is preferably an on-chip integration capacitor 112. The on-chip capacitor 112 is desirable because it decreases system component count and consequent cost. However, off-chip integration capacitors provide a very useful variable control for the synthesizer dynamics. The capacitance of the off-chip capacitor can be easily increased if increased loop damping is desired, or decreased if faster frequency pull-in time is desired. To the contrary, with on-chip capacitors, there are no external components to allow such easy control of loop dynamics. Due to integrated circuit technology limitations, on-chip capacitors are much smaller (approximately 100 times) in value than off-chip capacitors. The loop dynamics are dependent on the voltage change over time on Cint 112, which is proportional to the QP 108 current divided by the value of Cint 112. Thus, to maintain similar loop dynamics with an on-chip capacitor, the charge pump current must be scaled proportionally to any change in the integration capacitor 112. Also, the corrections from the charge pump 108 will be less accurate when scaled to very low currents, resulting in lower charge pump signal to noise levels. When charge pump 108 input signal inc is active, a signal current $I_{qp}$ is integrated on Cint 112. When the inc signal goes inactive, a signal voltage or delta voltage proportional to $I_{qp}$ is held on Cint 112. The signal voltage is disturbed when the charge pump 108 turns off due to random noise effects, charge injection from carriers in switch channels, and coupling from gate to diffusion overlap capacitances, thus lowering the accuracy of the integrated charge pump current.

Figure 2:
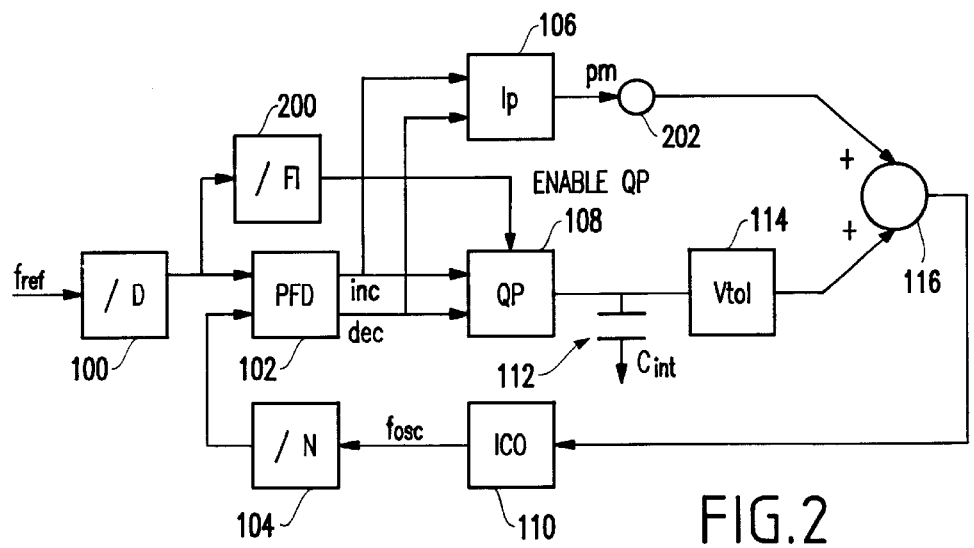
FIG. 2 is a schematic diagram of a frequency synthesizer.

FIG. 2 illustrates one embodiment of the invention that overcomes the problems that occur when using internal capacitors. More specifically, the frequency synthesizer in FIG. 2 includes two additional loop dynamic control devices. The first added control is a fractional integration counter 200 that includes a user-selected value FI. The second added control is a proportional multiplier 202 that has a user-selected value PM.

The output of the D frequency divider 100, $f_{ref}/D$, is the input to the FI counter 200 and the PFD 102. The FI counter 200 also functions as a frequency divider such that its output is a signal with frequency $f_{ref}/(D*FI)$ and duty cycle of 1/FI.

The output of the FI counter 200 is an enabling input (enable QP) to the charge pump 108. The PFD 102 produces increment and decrement (inc/dec) corrections to the charge pump 108. The inc/dec corrections are proportional to the phase difference of signals $f_{ref}/D$ and $f_{osc}/N$ at the input of the phase frequency detector 102.

With the invention, a fractional integration counter 200 is used to raise the charge pump current. Larger current and voltage signals will suffer less from the same noise source and therefore have a higher signal-to-noise ratio. The invention allows higher voltage/current signals to be output from the charge pump 108 and simultaneously reduces the number of times the signal is output from the charge pump. The invention performs this action by enabling or disabling the charge pump with the enable QP signal from the fractional integration counter 200. In other words, instead of outputting a very low current/voltage signal every clock cycle, the invention outputs a larger current/voltage signal every few cycles, which provides the same modification of loop dynamics, yet avoids the noise problems associated with very low current/voltage signals. For example, the invention may output a signal that is 10 times larger than the desired signal, however would only output that larger signal one-tenth as often. Therefore, with the invention a higher voltage/current signal is output by the charge pump 108. However, such a signal is output from the charge pump 108 less often (because of the restrictive control of the fractional integration counter 200 which results in the desired modification of the loop dynamics). When the fractional integration counter is employed with the charge pump, a fixed charge pump signal current can be chosen such that the desired signal to noise ratio can be achieved, and the effective charge pump current can be modified by the user-selected value FI, as described below.

The PFD 102 produces an output signal every $f_{ref}/D$ reference cycles. The charge pump 108 provides an output current $I_{qp}$, when inc is high and dec is low, and $-I_{qp}$, when dec is high and inc is low. Additionally, the charge pump receives the input controlling signal, 'enable QP', such that when 'enable QP' is high, the inc/dec corrections produce an output current, and when 'enable QP' is low, the output current from the charge pump 108 is zero. This masking of inc/dec corrections results in a lower effective charge pump current $I_{eff}$ which is approximately $I_{qp}/FI$. Therefore, the fractional integration counter 200 allows the user to adjusts loop dynamics by simply adjusting the FI value.

Further, lower effective charge pump currents are achieved with the invention because the charge pump 108 output is disabled and enabled by the fractional integration counter 200, depending on the value FI. For example, a programmable n-bit binary counter could be implemented such that the value FI is equal to $2^n$. The value of n would be user selectable. If n is 5, then FI would be $2^5$ or 32. The fractional integration counter 200 will count $f_{ref}/D$ cycles and produce the 'enable QP' output signal with frequency $f_{ref}/D$ divided by 32 ($2^n$) and duty cycle of 1/32. The charge pump 108 would therefore be enabled only one of every 32 inc/dec corrections from PFD 102, producing an effective charge pump current approximately equal to $I_{qp}/32$.

Figure 3:
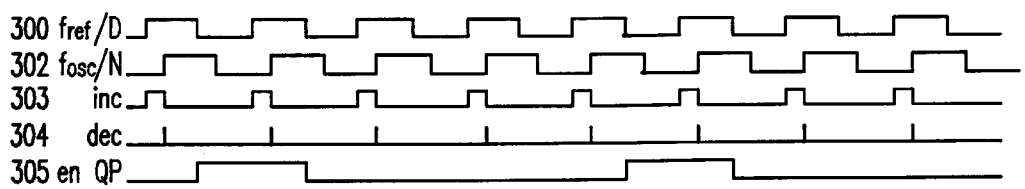
FIG. 3 is a timing diagram showing the various signals processed through the frequency synthesizer shown in FIG. 2 over time.

FIG. 3 shows the waveforms of the signals for a PFD 102 and fractional integration counter 200. The first signal 300 is $f_{ref}/D$ from D frequency divider 100. The second signal 302 is $f_{osc}/N$ from N frequency divider 104. Signals $f_{ref}/D$ and $f_{osc}/N$ are inputs to PFD 102. The third 303 and fourth 304 signals are inc and dec respectively from PFD 102. In the example, $f_{ref}/D$ leads $f_{osc}/D$, and PFD 102 output is an inc correction that is proportional to the phase difference of the rising edge of the input signals. The short dec pulse is an anti-deadband pulse produced by PFD 102, which is independent of the phase of the input signals. Anti-deadband pulses are commonly used in phase-frequency detector design to improve detection accuracy when the input signals have very small phase difference, a practice well known by those skilled in the art. Signal $f_{ref}/D$ is also an input to the fractional integration counter 200. The last signal 305 in FIG. 3 is enable_QP which is the output of the fractional integration counter 200. In the example, FI=4 and the fractional integration counter 200 output will be pulsed one of every four $f_{ref}/D$ input pulses. This will provide an effective charge pump current of $I_{qp}/4$.

When the charge pump 108 has a fixed correction current as in FIG. 1, the user has no ability to adjust the frequency synthesizer loop dynamics. When the fractional integration counter 200 is used in conjunction with a charge pump 108 with fixed correction current, the user can select the value FI for the counter, effectively lower the charge pump current, and adjust the frequency synthesizer loop dynamics as desired.

As mentioned above, the second added control that is included in the frequency synthesizer shown in FIG. 2 is a proportional multiplier 202 that has a user-selected value PM (Proportional Multiplier). The proportional correction block 106 receives input signals inc and dec from the PFD 102. The proportional correction block 106 will output a current $I_p$, when inc is high and dec is low, and $-I_p$, when dec is high and inc is low. The proportional multiplier 202 will modify the correction signal $I_p$ to be $I_p$ *PM, when inc is high and dec is low, and $-I_p$ *PM, when dec is high and inc is low. For example, the proportional correction 106 and proportional multiplier 202 can be implemented such that a base correction and multiples of the base can be enabled by the user, providing possible correction values such as $I_p$, $2*I_p$, $3*I_p$, and so on. As described previously, the invention utilizes a proportional-integral (PI) loop filter for the frequency synthesizer comprised of a charge pump (QP) 108 with fractional integration counter 200, integration capacitor (Cint) 112, voltage-to-current converter (VtoI) 114, and proportional correction (Ip) 106 with proportional multiplier 202. As with changing the charge pump 108 current, changing the proportional correction current will modify the loop filter parameters and therefore the frequency synthesizer loop dynamics. When the proportional correction block 106 has a fixed correction current as in FIG. 1, the user has no ability to adjust the frequency synthesizer loop dynamics. When the proportional multiplier 202 is used in conjunction with the proportional correction 106 with fixed correction current, the user can select the value PM to scale the proportional correction current and adjust the frequency synthesizer loop dynamics as desired.

Thus, the proportional multiplier 202 allows the user to adjust frequency synthesizer loop dynamics by simply changing the PM value. In other words, the proportional multiplier 202 selectively multiplies the output from the proportional corrections circuit 106 to allow the user to adjust the damping and bandwidth within the frequency synthesizer.

The damping and bandwidth parameters describe the loop behavior over the average of several cycles of corrections. When examined individually the proportional corrections appear as impulses. These correction impulses cause rapid phase changes which are detrimental to hard disk operation. If the phase changes rapidly when writing data, then the clock and data recovery loop must adapt to those phase changes during the read operation. If the rate of phase change is too large, the rate of change can exceed the capacity of the read loop to adapt. This is a cause of failure manifested as soft error rate in hard disk drives. The ability to alter the proportional corrections through the proportional multiplier is thus valuable to optimization of soft error rate in hard disk drives during characterization of hardware.

Figure 4:
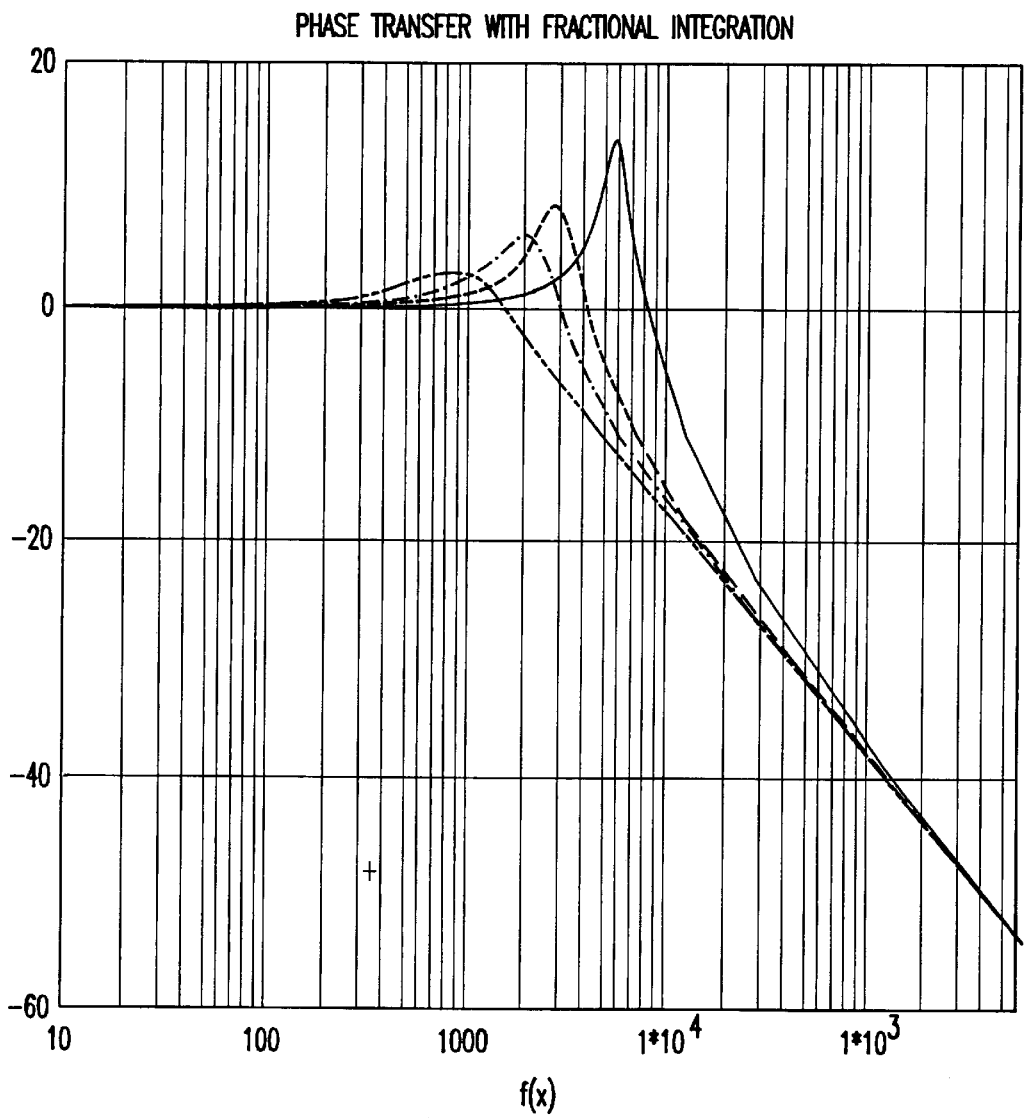
FIG. 4 is a graph illustrating phase transfer with fractional integration.

Referring now to the graphs shown in FIGS. 4–7, the performance of the invention is illustrated. More specifically, FIG. 4 is a plot of the frequency synthesizer phase transfer versus frequency using the fractional integration unit 200. In FIG. 4, the phase transfer for the loop is defined as the phase of signal $f_{ref}/D$ from D frequency divider 100 divided by the phase of feedback signal $f_{osc}/N$ from N frequency divider 104. In this example, PM is equal to one for all four traces and FI is equal to 1, 4, 8, and 32. As can be seen in FIG. 4, as FI is increased, the phase transfer becomes more damped and the loop bandwidth is decreased. A large current may be necessary to achieve adequate signal to noise ratio for the charge pump 108, but the loop will be significantly underdamped as is the case when FI=1. When FI=1, the charge pump 108 is enable for every inc/dec correction. When FI is increased to 32, the charge pump 108 is enabled by the fractional integration counter 200 only one of every 32 inc/dec corrections, lowering the effective charge pump current and achieving loop critical damping.

Figure 5:
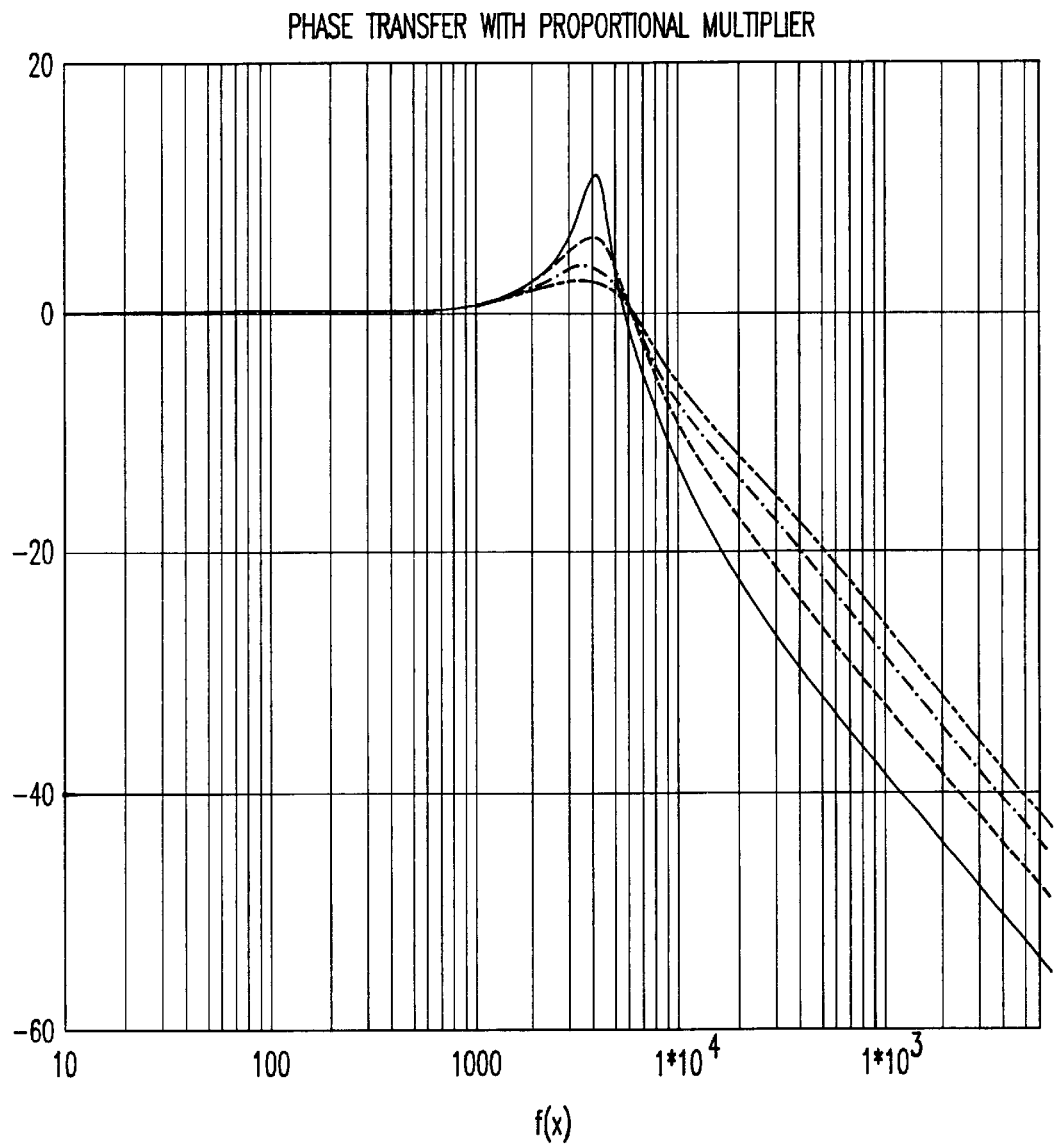
FIG. 5 is a graph illustrating phase transfer with a proportional multiplier.

FIG. 5 is a graph that shows the phase transfer when PM is varied. In this example, FI is held equal to 2 and PM is varied between 1, 2, 3, and 4. As can be seen in FIG. 5, as PM is increased, the phase transfer becomes more damped and the loop bandwidth is increased. When PM=1, the base correction value is used for the proportional multiplier 202 and the loop is significantly underdamped. When PM is increased to 4, the proportional correction is four times greater than the base correction and loop critical damping is achieved.

When FI is adjusted independently, increasing FI will increase loop damping and decrease loop bandwidth. When PM is adjusted independently, increasing PM will increase loop damping and increase loop bandwidth. So, while the desired loop damping may be achieved, the resulting loop bandwidth may not be at the desired frequency. It may be desirable from the user standpoint to adjust loop damping to be critically damped to insure stability, and at the same time adjust loop bandwidth to a specific frequency. User adjustment of the variables FI and PM can be used in combination, to gain two dimensional control of the loop dynamics. More specifically, the user can tune in a desired Loop Bandwidth while maintaining a constant loop damping or vice versa.

Figure 6:
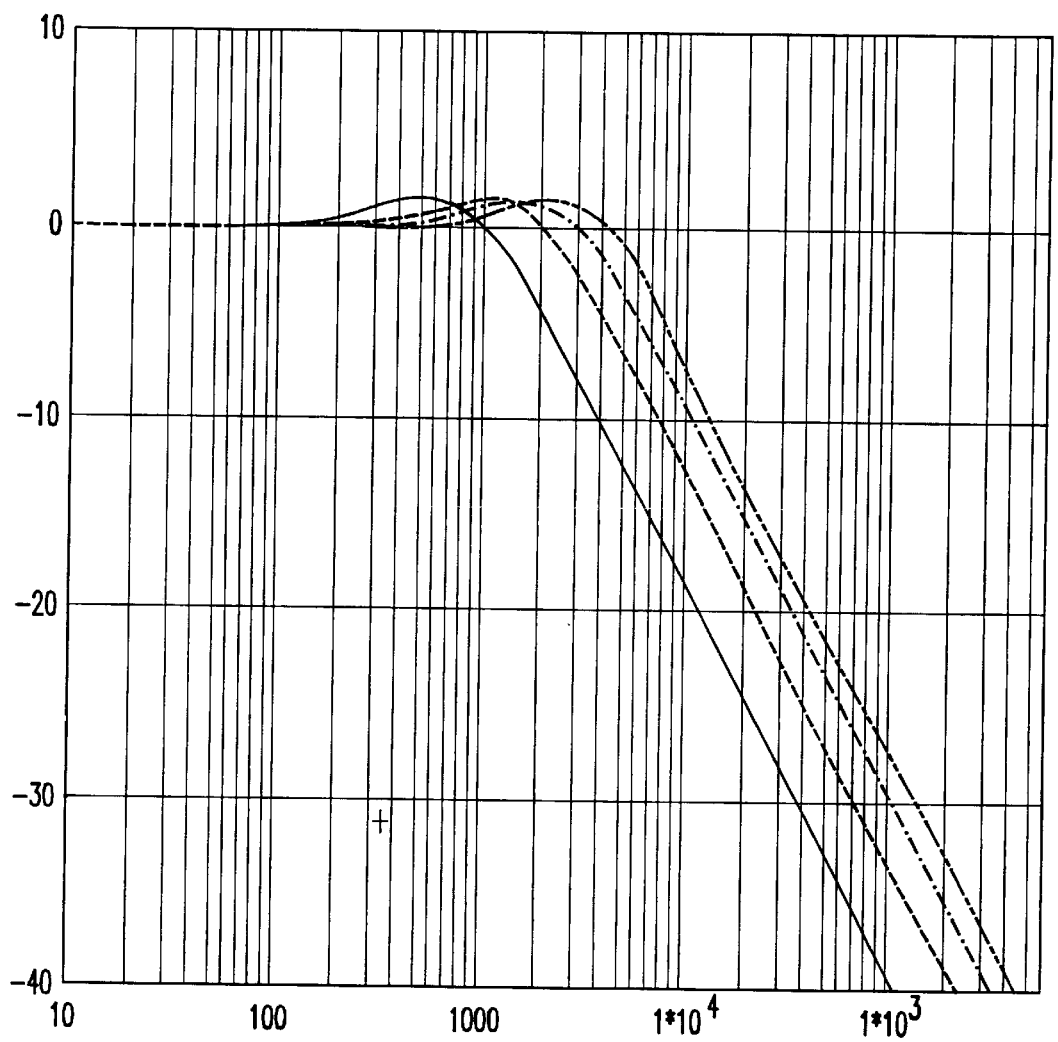
FIG. 6 is a graph illustrating phase transfer with the inventive loop dampening.
Figure 7:
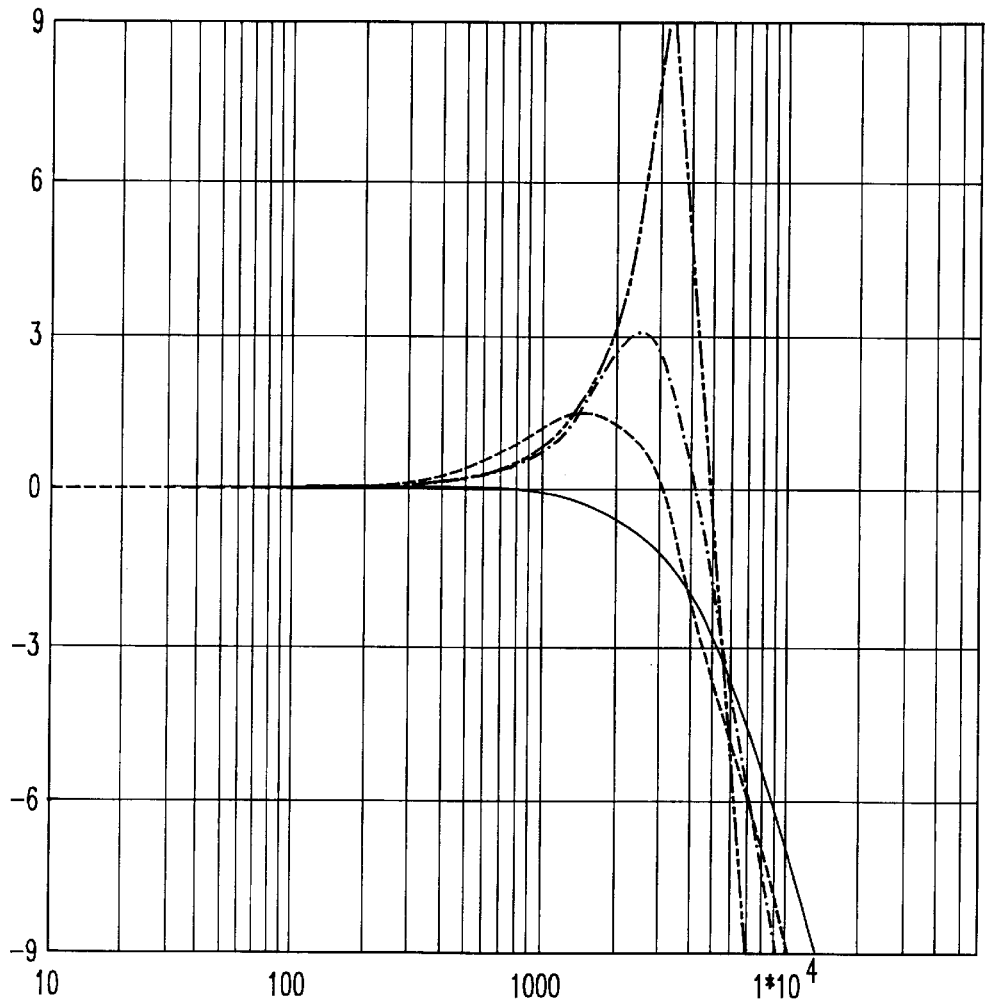
FIG. 7 is a graph illustrating phase transfer with the inventive loop dampening.

FIGS. 6 and 7 show the Phase Transfer of the loop with a combination of FI and PM settings. As seen in FIG. 6, appropriate values for FI and PM can be chosen such that a constant loop damping is maintained while loop bandwidth is modified. In other words, increasing FI and decreasing PM appropriately will decrease loop bandwidth while maintaining constant loop damping. Likewise, FIG. 7 illustrates that appropriate values for FI and PM can be chosen such that loop damping can be adjusted, while loop bandwidth is maintained.

Therefore, as discussed above, when a frequency synthesizer has small on-chip timing-loop filter capacitor, there is a problem scaling charge pump currents which makes it difficult to achieve desired loop dynamics. More specifically, a low current charge pump has a low signal-to-noise due to random noise, charge injection, and coupling from gate to diffusion overlap capacitances. With the invention, a fractional integration counter 200 is used to raise the charge pump current and provide fixed current corrections that achieves sufficient signal to noise ratio. Further, lower effective charge pump currents are produced with the invention because the Phase-Frequency Detector 102 output is selectively masked by the fractional integration counter 200.

In a similar manner, the proportional multiplier 202 allows the user to adjusts frequency synthesizer loop dynamics by simply changing the PM value. As mentioned above, the synthesizer low pass filter is a proportional-integral (P-I) type. The proportional circuit 106 output has a base correction and can be modified by the proportional multiplier 202 to provide scaling of the base. The proportional multiplier 202, when used with fractional integration counter 200 can adjust loop bandwidth and maintain damping or vice versa. As described above, the invention provides two dimensional control, providing the user the ability to adjust loop dynamics to meet specific performance requirements, such as loop bandwidth, jitter performance and soft error rate while maintaining loop stability.

While the invention has been described in terms of preferred embodiments, those skilled in the art will recognize that the invention can be practiced with modification within the spirit and scope of the appended claims.

What is claimed is:

1. A frequency synthesizer comprising:
   a phase frequency detector;
   a proportional correction circuit connected to said phase frequency detector and being adapted to provide a current correction; and
   a proportional multiplier connected to said proportional correction circuit and being adapted to alter a value of said current correction.

2. The frequency synthesizer in claim 1, further comprising a charge pump connected to said phase frequency detector and receiving an increment/decrement signal from said phase frequency detector.

3. The frequency synthesizer in claim 2, further comprising a fractional integration counter connected to said charge pump and being adapted to alter current of said charge pump.

4. The frequency synthesizer in claim 3, wherein said fractional integration counter includes a user-defined input and said fractional integration counter alters said current of said charge pump based upon said user-defined input.

5. The frequency synthesizer in claim 3, wherein said fractional integration counter allows an increase in a signal-to-noise ratio of said charge pump.

6. The frequency synthesizer in claim 1, wherein said proportional multiplier includes a user-defined input and said proportional multiplier alters said value of said current correction based upon said user-defined input.

7. The frequency synthesizer in claim 1, wherein said proportional multiplier modifies a damping within said frequency synthesizer.

8. A frequency synthesizer comprising:
   a charge pump;
   a fractional integration counter connected to said charge pump and being adapted to alter current of said charge pump;
   a phase frequency detector supplying an increment/decrement signal to said charge pump;
   a proportional correction circuit connected to said phase frequency detector and being adapted to provide a current correction; and
   a proportional multiplier connected to said proportional correction circuit and being adapted to alter a value of said current correction.

9. The frequency synthesizer in claim 8, wherein said fractional integration counter includes a user-defined input and said fractional integration counter alters said current of said charge pump based upon said user-defined input.

10. The frequency synthesizer in claim 8, wherein said fractional integration counter allows an increase in a signal-to-noise ratio of said charge pump.

11. The frequency synthesizer in claim 8, wherein said proportional multiplier includes a user-defined input and said proportional multiplier alters said value of said current correction based upon said user-defined input.

12. The frequency synthesizer in claim 8, wherein said proportional multiplier modifies a damping within said frequency synthesizer.

13. A frequency synthesizer comprising:
    a charge pump; and
    a fractional integration counter, coupled to said charge pump, having a user-defined input for altering the current of the charge pump.

14. A frequency synthesizer comprising:
    a charge pump; and
    a fractional integration counter coupled to said charge pump, the fractional integration counter being adapted to alter current of said charge pump, and allow an increase in a signal-to-noise ratio of said charge pump.

* * * * *